United States Patent
Yang et al.

(10) Patent No.: US 12,349,462 B2
(45) Date of Patent: Jul. 1, 2025

(54) ARRAY SUBSTRATE AND LIQUID CRYSTAL DISPLAY PANEL

(71) Applicant: Wuhan China Star Optoelectronics Technology Co., Ltd., Hubei (CN)

(72) Inventors: Congxing Yang, Hubei (CN); Chunpeng Zhang, Hubei (CN); Fei AI, Hubei (CN); Jianfeng Yuan, Hubei (CN)

(73) Assignee: Wuhan China Star Optoelectronics Technology Co., Ltd., Wuhan (CN)

( * ) Notice: Subject to any disclaimer, the term of this patent is extended or adjusted under 35 U.S.C. 154(b) by 0 days.

(21) Appl. No.: 18/561,748

(22) PCT Filed: Oct. 31, 2023

(86) PCT No.: PCT/CN2023/128872
§ 371 (c)(1),
(2) Date: Nov. 17, 2023

(65) Prior Publication Data
US 2025/0126892 A1    Apr. 17, 2025

(30) Foreign Application Priority Data
Oct. 16, 2023    (CN) .......................... 202311347955.X

(51) Int. Cl.
*H10D 86/40*    (2025.01)
*G02F 1/1345*   (2006.01)
(Continued)

(52) U.S. Cl.
CPC ....... *H10D 86/451* (2025.01); *G02F 1/13454* (2013.01); *G02F 1/136209* (2013.01); *G02F 1/1368* (2013.01); *G02F 2201/501* (2013.01)

(58) Field of Classification Search
CPC .............. H10D 86/451; G02F 1/13454; G02F 1/136209; G02F 1/1368; G02F 2201/501
See application file for complete search history.

(56) References Cited

U.S. PATENT DOCUMENTS 10,181,502 B2   1/2019  Oh
11,342,364 B2   5/2022  Tanaka

FOREIGN PATENT DOCUMENTS

CN    105047567    11/2015
CN    105390502    3/2016
(Continued)

OTHER PUBLICATIONS

English Machine Translation of Luo et al CN 111 627 929 (Year: 2025).*
(Continued)

*Primary Examiner* — Donald L Raleigh

(57) ABSTRACT

An embodiment of the present application discloses an array substrate and a liquid crystal display panel. The array substrate uses a first barrier layer including a first aperture in an aperture region. The first barrier layer is at least correspondingly disposed in a thin film transistor disposing region and a gate driver on array circuit region. The first barrier layer is configured to block the alkaline cation from spreading along a direction to the active layer. Along a direction at a right angle from the substrate to the active layer, a depth by which the alkaline cation enters the first barrier layer is less than or equal to 20 Å.

20 Claims, 6 Drawing Sheets

(51) Int. Cl.
*G02F 1/1362* (2006.01)
*G02F 1/1368* (2006.01)

(56) References Cited

FOREIGN PATENT DOCUMENTS

| CN | 110620120 | | | 12/2019 | | |
|---|---|---|---|---|---|---|
| CN | 111627929 | | | 9/2020 | | |
| CN | 111627929 | A | * | 9/2020 | ........... | G02F 1/1333 |
| CN | 112216705 | | | 1/2021 | | |
| KR | 10-2017-0081008 | | | 7/2017 | | |
| KR | 10-2022-0003423 | | | 1/2022 | | |

OTHER PUBLICATIONS

International Search Report and the Written Opinion Dated Jun. 26, 2024 From the International Searching Authority Re. Application No. PCT/CN2023/128872 and Its Translation Into English. (15 Pages).
Notification of Office Action and Search Report Dated Nov. 5, 2024 From the National Intellectual Property Agency of the People's Republic of China Re. Application No. 202311347955.X and Its Translation Into English. (23 Pages).

\* cited by examiner

ARRAY SUBSTRATE AND LIQUID CRYSTAL DISPLAY PANEL

RELATED APPLICATIONS

This application is a National Phase of PCT Patent Application No. PCT/CN2023/128872 having International filing date of Oct. 31, 2023, which claims the benefit of priority of China Patent Application No. 202311347955.X filed on Oct. 16, 2023. The contents of the above applications are all incorporated by reference as if fully set forth herein in their entirety.

FIELD OF INVENTION

The present application relates to a field of display technologies, especially to an array substrate and a liquid crystal display panel.

BACKGROUND OF INVENTION

A liquid crystal display panel is mainly divided by functions into the pixel display region (Active Area, AA), the gate driver on the array (GOA) circuit region, and the demultiplex (DEMUX) circuit region, etc. The AA region is a display image region for devices such as cell phones and televisions, which have a sensitive requirement for light transmittance. The GOA region serves as the signal control region for the gate electrode of the thin-film transistors in the AA region, with a particular emphasis on the stability of the thin-film transistors. The DEMUX region acts as the signal control region for the source and drain electrodes of the thin-film transistors in the AA region, with a higher demand for rapid switching of the thin-film transistors.

Current product lines typically have a uniform structure for the entire glass substrate, meaning that the various film layers of the thin-film transistors prepared on a single glass substrate are essentially the same. At the same scale, this makes the characteristics of all the thin-film transistors nearly identical and, as a result, cannot meet the unique requirements for different regions.

SUMMARY OF INVENTION

An embodiment of the present application provides an array substrate and a liquid crystal display panel that can improve stability of thin film transistors in a gate driver on array circuit region and a pixel display region whiling improving pixel display region light transmittance.

The embodiment of the present application provides an array substrate, comprising a pixel display region and a gate driver on array circuit region, wherein the gate driver on array circuit region is located on at least one side of the pixel display region, the pixel display region comprises an aperture region and a thin film transistor disposing region, the aperture region is located on a side of the thin film transistor disposing region, the aperture region is configured to transmit light from a backlight module, and the array substrate comprises:

a substrate;
a first barrier layer disposed on the substrate, wherein the first barrier layer comprises a first aperture in the aperture region, the first barrier layer are at least disposed correspondingly in the thin film transistor disposing region and the gate driver on array circuit region;
a buffer layer disposed on a side of the first barrier layer away from the substrate, wherein the buffer layer covers the aperture region, the thin film transistor disposing region, and the gate driver on array circuit region;
a thin film transistor structure layer disposed on a surface of the buffer layer away from the substrate, wherein the thin film transistor structure layer comprises a first thin film transistor and a second thin film transistor, the first thin film transistor is located in the thin film transistor disposing region, and the second thin film transistor is disposed in the gate driver on array circuit region;
wherein the first barrier layer is configured to block an alkaline cation from spreading along a direction toward the active layer, and along a direction at a right angle from the substrate to the active layer, a depth by which the alkaline cation enters the first barrier layer is less than or equal to 20 Å.

Optionally, in some embodiments of the present application, the thin film transistor structure layer comprises an active layer, a gate electrode insulation layer, and a first metal layer, the active layer is disposed on a surface of the buffer layer away from the substrate, the gate electrode insulation layer is disposed on a surface of the active layer away from the buffer layer, the first metal layer comprises a gate electrode, the first metal layer is disposed on a surface of the gate electrode insulation layer away from the active layer, the first metal layer is at least disposed in the thin film transistor disposing region and the gate driver on array circuit region;

the array substrate further comprises a second barrier layer disposed between the first metal layer and the gate electrode insulation layer, the second barrier layer comprises a second aperture defined between the aperture region and the thin film transistor disposing region, the second barrier layer is disposed correspondingly in the gate driver on array circuit region; and
the second barrier layer is configured to block the alkaline cation from spreading along the direction toward the active layer, and along a direction at a right angle from the first metal layer to the active layer, a depth by which the alkaline cation enters the second barrier layer is less than or equal to 20 Å.

Optionally, in some embodiments of the present application, the array substrate further comprises a demultiplex circuit region, the demultiplex circuit region is located at at least one end of the pixel display region;
the first barrier layer, the buffer layer, the active layer, the gate electrode insulation layer, and the first metal layer are disposed correspondingly in the demultiplex circuit region, and the thin film transistor structure layer further comprises a third thin film transistor located in the demultiplex circuit region; and
a thickness of a portion of the gate electrode insulation layer disposed in the demultiplex circuit region is less than a thickness of a portion of the gate electrode insulation layer disposed in the gate driver on array circuit region.

Optionally, in some embodiments of the present application, a thickness of a portion of the gate electrode insulation layer disposed in the pixel display region is less than a thickness of a portion of the gate electrode insulation layer disposed in the gate driver on array circuit region.

Optionally, in some embodiments of the present application, the thickness of the portion of the gate electrode insulation layer disposed in the pixel display region is greater than the thickness of the portion of the gate electrode insulation layer disposed in the demultiplex circuit region.

Optionally, in some embodiments of the present application, the second barrier layer comprises a third aperture defined in the second barrier layer in the demultiplex circuit region.

Optionally, in some embodiments of the present application, a dielectric constant of the gate electrode insulation layer is greater than or equal to 6.8.

Optionally, in some embodiments of the present application, a light transmittance of each of the gate electrode insulation layer and the buffer layer is greater than or equal to 90%.

Optionally, in some embodiments of the present application, the gate electrode insulation layer is a single-film layer structure or a multi-film layer stack structure, and the buffer layer is a single-film layer structure or a multi-film layer stack structure.

Optionally, in some embodiments of the present application, the array substrate further comprises a light shielding layer, the light shielding layer and the first barrier layer are disposed on a side of the substrate, the light shielding layer comprises a fourth aperture defined in the light shielding layer in the aperture region, the light shielding layer is at least correspondingly disposed in the thin film transistor disposing region, and the light shielding layer at least overlaps a portion of the active layer located in the thin film transistor disposing region.

Optionally, in some embodiments of the present application, the light shielding layer is disposed between the buffer layer and the first barrier layer, or, the light shielding layer is disposed between the substrate and the first barrier layer.

Optionally, in some embodiments of the present application, material of the gate electrode insulation layer comprises at least one of silicon oxide, silicon oxynitride, hafnium oxide, and aluminum oxide, and material of the buffer layer comprises at least one of silicon oxide, silicon oxynitride, hafnium oxide, aluminum oxide, polyvinyl alcohol, polyethylene glycol, and polyethylene glycol.

Optionally, in some embodiments of the present application, the thin film transistor structure layer further comprises:
  a source and drain insulation layer disposed on a surface of the first metal layer away from the buffer layer and covering the gate electrode insulation layer; and
  a second metal layer disposed on a surface of the source and drain insulation layer away from the gate electrode insulation layer, wherein the second metal layer is at least disposed in the thin film transistor disposing region and the gate driver on array circuit region, the second metal layer comprises a source electrode and a drain electrode, in the thin film transistor, the source electrode is connected to a source electrode contact region of the active layer, the drain electrode is connected to a drain electrode contact region of the active layer;
  wherein the gate electrode, the active layer, the source electrode, and the drain electrode located in the thin film transistor disposing region are configured to constitute the first thin film transistor, the gate electrode, the active layer, the source electrode, and the drain electrode located in the gate driver on array circuit region are configured to constitute the second thin film transistor, and the gate electrode, the active layer, the source electrode, and the drain electrode located in the demultiplex circuit region are configured to constitute the third thin film transistor.

The embodiment of the present application also provides a liquid crystal display panel, comprising the array substrate of any one of the above embodiments. For instance: the array substrate comprises a pixel display region and a gate driver on array circuit region, the gate driver on array circuit region is located on at least one side of the pixel display region, the pixel display region comprises an aperture region and a thin film transistor disposing region, the aperture region is located on a side of the thin film transistor disposing region, the aperture region is configured to transmit light from a backlight module, and the array substrate comprises:
  a substrate;
  a first barrier layer disposed on the substrate, wherein the first barrier layer comprises a first aperture in the aperture region, the first barrier layer are at least disposed correspondingly in the thin film transistor disposing region and the gate driver on array circuit region;
  a buffer layer disposed on a side of the first barrier layer away from the substrate, wherein the buffer layer covers the aperture region, the thin film transistor disposing region, and the gate driver on array circuit region;
  a thin film transistor structure layer disposed on a surface of the buffer layer away from the substrate, wherein the thin film transistor structure layer comprises a first thin film transistor and a second thin film transistor, the first thin film transistor is located in the thin film transistor disposing region, and the second thin film transistor is disposed in the gate driver on array circuit region;
  wherein the first barrier layer is configured to block an alkaline cation from spreading along a direction toward the active layer, and along a direction at a right angle from the substrate to the active layer, a depth by which the alkaline cation enters the first barrier layer is less than or equal to 20 Å.

Optionally, in some embodiments of the present application, the thin film transistor structure layer comprises an active layer, a gate electrode insulation layer, and a first metal layer, the active layer is disposed on a surface of the buffer layer away from the substrate, the gate electrode insulation layer is disposed on a surface of the active layer away from the buffer layer, the first metal layer comprises a gate electrode, the first metal layer is disposed on a surface of the gate electrode insulation layer away from the active layer, the first metal layer is at least disposed in the thin film transistor disposing region and the gate driver on array circuit region;
  the array substrate further comprises a second barrier layer disposed between the first metal layer and the gate electrode insulation layer, the second barrier layer comprises a second aperture defined between the aperture region and the thin film transistor disposing region, the second barrier layer is disposed correspondingly in the gate driver on array circuit region; and
  the second barrier layer is configured to block the alkaline cation from spreading along the direction toward the active layer, and along a direction at a right angle from the first metal layer to the active layer, a depth by which the alkaline cation enters the second barrier layer is less than or equal to 20 Å.

Optionally, in some embodiments of the present application, the array substrate further comprises a demultiplex circuit region, the demultiplex circuit region is located at at least one end of the pixel display region;

the first barrier layer, the buffer layer, the active layer, the gate electrode insulation layer, and the first metal layer are disposed correspondingly in the demultiplex circuit region, and the thin film transistor structure layer further comprises a third thin film transistor located in the demultiplex circuit region; and a thickness of a portion of the gate electrode insulation layer disposed in the demultiplex circuit region is less than a thickness of a portion of the gate electrode insulation layer disposed in the gate driver on array circuit region.

Optionally, in some embodiments of the present application, a thickness of a portion of the gate electrode insulation layer disposed in the pixel display region is less than a thickness of a portion of the gate electrode insulation layer disposed in the gate driver on array circuit region.

Optionally, in some embodiments of the present application, the thickness of the portion of the gate electrode insulation layer disposed in the pixel display region is greater than the thickness of the portion of the gate electrode insulation layer disposed in the demultiplex circuit region.

Optionally, in some embodiments of the present application, the second barrier layer comprises a third aperture defined in the second barrier layer in the demultiplex circuit region.

Optionally, in some embodiments of the present application, a dielectric constant of the gate electrode insulation layer is greater than or equal to 6.8.

Advantages

The array substrate and the liquid crystal display panel provided by the embodiment of the present application employs the first barrier layer comprising a first aperture in the aperture region and at least correspondingly disposed in thin film transistor disposing region and the gate driver on array circuit region. The first barrier layer is configured to block the alkaline cation from spreading along a direction to the active layer. Along a direction at a right angle from the substrate to the active layer, a depth by which the alkaline cation enters the first barrier layer is less than or equal to 20 Å.

Because the first barrier layer avoids the aperture region by the first aperture, a light transmittance capability of the aperture region is improved. Also, the first barrier layer is disposed in the thin film transistor disposing region and the gate driver on array circuit region configured to block the alkaline cation from entering the active layer, which improves the stability of thin film transistors in the thin film transistor disposing region and the gate driver on array circuit region. Furthermore, after manufacturing the array substrate, the depth by which the alkaline cation spreads and enters the first barrier layer is less than or equal to 20 Å, which can ensure that the alkaline cation would not spread to the active layer, and even would not spread to the active layer after a very long time period, which achieves improvement of a time length of the thin film transistor stability and an adequately thinned thickness of the first barrier layer while improving the thin film transistor stability.

DETAILED DESCRIPTION OF PREFERRED EMBODIMENTS

Figure 1:
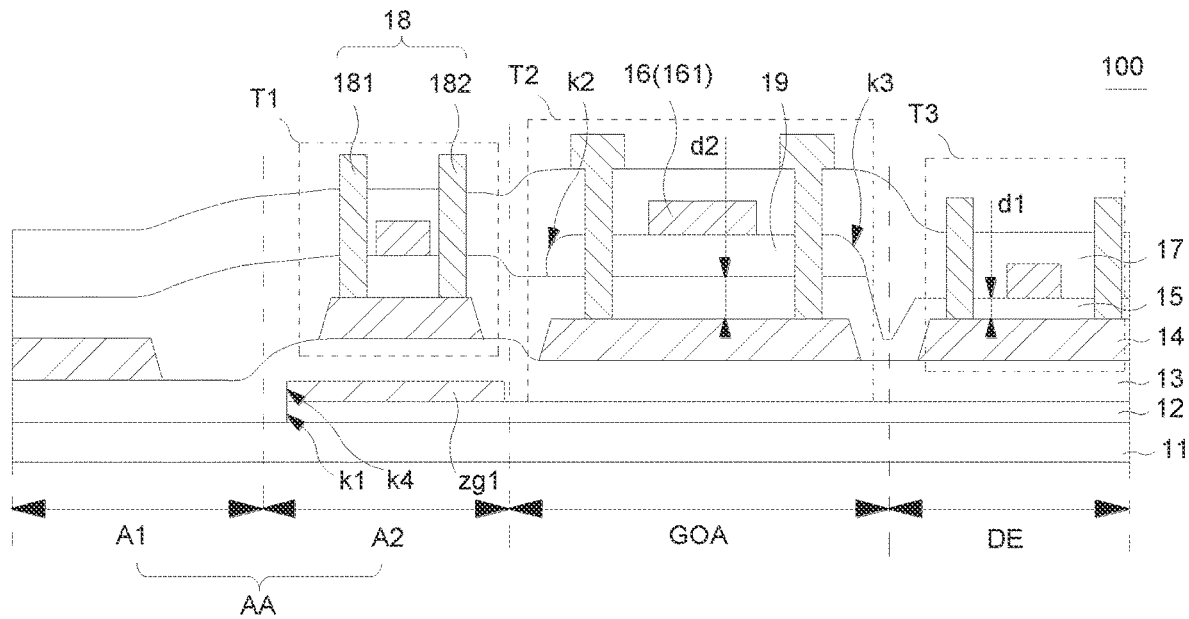
FIG. 1 is a schematic structural view of an array substrate provided by an embodiment of the present application.

The technical solution in the embodiment of the present application will be clearly and completely described below with reference to the accompanying drawings in the embodiments of the present application. Apparently, the described embodiments are merely some embodiments of the present application instead of all embodiments. According to the embodiments in the present application, all other embodiments obtained by those skilled in the art without making any creative effort shall fall within the protection scope of the present application. In addition, it should be understood that the specific embodiments described here are only used to illustrate and explain the present application, and are not used to limit the present application. In the present application, the used orientation terminologies such as "upper" and "lower", when not specified to the contrary explanation, usually refer to the upper and lower states of the device in actual use or working conditions, specifically according to the direction of the figures in the drawings. Furthermore, "inner" and "outer" refer to the outline of the device. The terms "first," "second," "third," etc., are used solely for marking purposes and do not impose any numeric requirement or establish an order.

An embodiment of the present application provides an array substrate and a liquid crystal display panel, which will be described in detail as follows. It should be explained that the order of descriptions in the following embodiments is not to limit the preferred order of the embodiments.

With reference to FIG. 1, the embodiment of the present application provides an array substrate 100 comprising a pixel display region AA and a gate driver on array circuit region GOA. The gate driver on array circuit region GOA is located on at least one side of the pixel display region AA. The pixel display region AA comprises an aperture region A1 and a thin film transistor disposing region A2. The aperture region A1 is located on a side of the thin film transistor disposing region A2. The aperture region A1 is configured to transmit light from a backlight module. The array substrate 100 comprises a substrate 11, a first barrier layer 12, a buffer layer 13, and a thin film transistor structure layer. The thin film transistor structure layer comprises a first thin film transistor T1 and a second thin film transistor T2. The first thin film transistor T1 is located in the thin film transistor disposing region A2. The second thin film transistor T2 is disposed in the gate driver on array circuit region GOA.

Film layers of the thin film transistor structure layer comprises an active layer 14, a gate electrode insulation layer 15, a first metal layer 16, a source and drain insulation layer 17, and a second metal layer 18.

The first barrier layer 12 is disposed on the substrate 11. The first barrier layer 12 comprises a first aperture k1 defined in the first barrier layer 12 in the aperture region A1. The first barrier layer 12 is at least correspondingly disposed in the thin film transistor disposing region A2 and the gate driver on array circuit region. The buffer layer 13 is disposed on a side of the first barrier layer 12 away from the substrate 11. The buffer layer 13 covers the aperture region A1, the thin film transistor disposing region A2, and the gate driver on array circuit region GOA.

The active layer 14 is disposed on a surface of the buffer layer 13 away from the substrate 11. The gate electrode insulation layer 15 is disposed on a surface of the active layer 14 away from the buffer layer 13.

The first metal layer 16 comprises a gate electrode 161. The first metal layer 16 is disposed on a surface of the gate electrode insulation layer 15 away from the active layer 14. The first metal layer 16 avoids the aperture region A1 and is at least disposed in the thin film transistor disposing region A2 and the gate driver on array circuit region GOA. The source and drain insulation layer 17 is disposed on a surface of the first metal layer 16 away from the buffer layer 13 and covers the gate electrode insulation layer 15.

The second metal layer 18 is disposed on a surface of the source and drain insulation layer 17 away from the gate electrode insulation layer 15. The second metal layer 18 avoids the aperture region A1 and is at least disposed in the thin film transistor disposing region A2 and the gate driver on array circuit region GOA. The second metal layer 18 comprises a source electrode 181 and a drain electrode 182. In a thin film transistor, the source electrode 181 is connected to a source electrode contact region of the active layer 14, and the drain electrode 182 is connected to a drain electrode contact region of the active layer 14.

The gate electrode 161, the active layer 14, the source electrode 181, and the drain electrode 182 located in the thin film transistor disposing region A2 are configured to constitute the first thin film transistor T1. Portions of the gate electrode 161, the active layer 14, the source electrode 181, and the drain electrode 182 located in the gate driver on array circuit region GOA are configured to constitute the second thin film transistor T2.

The first barrier layer 12 is configured to block the alkaline cation from spreading along a direction to the active layer 14. Along a direction at a right angle from the substrate 11 to the active layer 14, a depth by which the alkaline cation enters the first barrier layer 12 is less than or equal to 20 Å. In the array substrate 100 of the present embodiment, the first aperture k1 is disposed in the aperture region A1. Namely, the first barrier layer 12 avoids the aperture region A1. Because the first barrier layer 12 avoids the aperture region A1, light from the backlight module irradiated on the aperture region A1 does not penetrate the first barrier layer 12, which lowers light loss and increases a light transmittance capability of the aperture region A1. Also, the first barrier layer 12 is disposed in the thin film transistor disposing region A2 and the gate driver on array circuit region GOA and is configured to block the alkaline cation from entering the active layer 14, which improves the stability of the thin film transistors (T1/T2) in the thin film transistor disposing region A2 and the gate driver on array circuit region GOA. Furthermore, after manufacture of the array substrate 100 is completed, a depth by which the alkaline cation spreads and enters the first barrier layer 12 is less than or equal to 20 Å, which can ensure that the alkaline cation would not spread to the active layer 14, and even would not spread to the active layer 14 after a very long time period, which achieves improvement of a time length of the stability of the thin film transistor (T1/T2) and an adequately thinned thickness of the first barrier layer 12 while improving the stability of the thin film transistor (T1/T2).

It should be explained that the aperture region A1 only corresponds to a region of the pixel electrode in the array substrate 100. In the liquid crystal display panel the black matrix disposed correspondingly on a periphery of the aperture region A1 would be employed, namely, in the pixel display region AA, a region not shielded by the black matrix layer is the aperture region A1.

Optionally, in the embodiment of the present application, the thin film transistor in the thin film transistor structure layer is a top gate type thin film transistor. However, in some embodiments, the thin film transistor in the thin film transistor structure layer can also be a bottom gate type or a dual gate type. In some embodiments, on the basis of the embodiment of FIG. 1, the same make is adopted to form the source electrode, the drain electrode, and the gate electrode disposed in the same layer to save the second metal layer 18 and the source and drain insulation layer 17.

Optionally, alkaline cation comprises Na+ and K+.

Along the direction at a right angle from the substrate 11 to the active layer 14, a depth by which the alkaline cation enters the first barrier layer 12 is less than or equal to 20 Å. For instance, the depth can be 20 Å, 19 Å, 18 Å, 17 Å, 16 Å, 15 Å, 14 Å, 13 Å, 12 Å, 11 Å, 10, 9 Å, 8, 7 Å, 6 Å, or 5 Å.

It can be understood that the shallower the depth by which the alkaline cation spreads and enters the first barrier layer 12 is, the stronger a blocking capability of the first barrier layer 12 to the alkaline cation, and the stronger the stability of the second thin film transistor T2.

Optionally, material of the first barrier layer 12 can comprise at least one of silicon nitride, hafnium oxide, aluminum oxide and zirconia.

In the present embodiment, material of the first barrier layer 12 is silicon nitride. Silicon nitride, after film formation, has a film layer with high compactness and strong blocking capability, which can thin a second barrier layer 19. Also, silicon nitride is a comparative low cost and advantages in mass production.

Optionally, a thickness of the first barrier layer 12 ranges from 200 Å to 2000 Å, for instance, the thickness can be 200 Å, 300 Å, 400 Å, 500 Å, 600 Å, 700 Å, 800 Å, 900 Å, 1000 Å, 1100 Å, 1200, 1300, 1400 Å, 1500 Å, 1600 Å, 1700 Å, 1800 Å, 1900 Å, or 2000 Å.

It can be understood that because the ion has a certain spreading capability in a normal temperature, the thicker the first barrier layer 12 is, the harder the ion spreads and penetrates the first barrier layer 12, the better a blocking effect of the first barrier layer 12 to the alkaline cation, and the longer the time period for blocking the alkaline cation is, which also increases a process cost.

Optionally, a light transmittance of each of the gate electrode insulation layer 15 and the buffer layer 13 is greater than or equal to 90%, for instance, the light transmittance can be 90%, 91%, 92%, 93%, 94%, 95%, 96%, 97%, 98%, or 99%.

The present embodiment selects the light transmittances of the gate electrode insulation layer 15 and the buffer layer 13 to be greater than or equal to 90% to ensure that the aperture region A1 has a high light transmittance.

Material of the buffer layer 13 can comprise at least one of silicon oxide, silicon oxynitride, hafnium oxide, aluminum oxide, polyvinyl alcohol, polyethylene glycol, and polyethylene glycol.

In the present embodiment, material of the buffer layer 13 is silicon oxide. A transmittance of the silicon oxide film layer is greater than 92%, which can guarantee the light transmittance. The silicon oxide film layer can improve an interface of the active layer 14 and improve the stability of the active layer 14. Also, a cost of the silicon oxide is comparatively low, thus facilitating mass production.

Optionally, a thickness of the buffer layer 13 ranges from 1000 Å to 3000 Å, for instance, the thickness can be 1000 Å, 1100 Å, 1200 Å, 1300 Å, 1400 Å, 1500 Å, 1600 Å, 1700 Å, 1800 Å, 1900 Å, 2000 Å, 2100 Å, 2200 Å, 2300 Å, 2400 Å, 2500 Å, 2600 Å, 2700 Å, 2800 Å, 2900 Å, or 3000 Å.

Optionally, a light transmittance of the gate electrode insulation layer 15 is greater than 90%.

Material of the gate electrode insulation layer 15 comprises at least one of silicon oxide, silicon oxynitride, hafnium oxide, and aluminum oxide. Optionally, the gate electrode insulation layer 15 is a single-film layer structure or a multi-film layer stack structure, and the buffer layer 13 is a single-film layer structure or a multi-film layer stack structure.

In the present embodiment, when the gate electrode insulation layer 15 is a single-film layer structure, material of the gate electrode insulation layer 15 is silicon oxide, and a transmittance of the silicon oxide film layer is greater than 92%, which can guarantee the light transmittance. The cost of silicon oxide is comparatively low, which facilitates mass production. Also, a dielectric constant of silicon oxide is comparatively low, which can improve an activation speed of a third thin film transistor T3.

In some embodiments, the gate electrode insulation layer 15 can also be an insulation layer with a dielectric constant greater than or equal to 6.8 to ensure that the gate electrode insulation layer comprises a stronger insulation property.

Optionally, the first metal layer 16 和 the second metal layer 18 can employ a metal element selected from chromium, copper, aluminum, gold, silver, zinc, molybdenum, tantalum, titanium, tungsten, manganese, nickel, iron, cobalt, an alloy including any one of the above metal elements, and a combination thereof. Furthermore, the first metal layer 16 and the second metal layer 18 can be a single-layer structure or a multi-layer structure with two or more layers.

Optionally, material of the active layer 14 can comprise monocrystal silicon, polycrystalline silicon (poly-Si), or oxide semiconductor.

Optionally, material of the source and drain insulation layer 17 can comprise at least one of silicon nitride, silicon oxide, silicon oxynitride, aluminum oxide, magnesium oxide, titanium oxide, and organic transparent material. The organic transparent material comprises transparent photoresist, epoxy resin, polyimide, polyvinyl alcohol, polymethylmethacrylate, polystyrene, etc.

In some embodiments, material of the source and drain insulation layer 17 is free of silicon nitride. Because the light transmittance of silicon nitride ranges from 80% to 85%, material of the source and drain insulation layer 17 is not silicon nitride, which can improve the light transmittance of the aperture region A1. For instance, material of the source and drain insulation layer 17 can be silicon oxynitride, which has better light transmittance and ion barrier capability and greater dielectric constant. The light transmittance, ion barrier capability, and dielectric constant can be matched for qualification by adjusting nitrogen and oxygen contents, which can fulfill demands of various functions and has a controllable cost.

Optionally, in an embodiment, the array substrate 100 further comprises a second barrier layer 19 disposed between the first metal layer 16 and the gate electrode insulation layer 15. The second barrier layer 19 comprises a second aperture k2 defined in the second barrier layer 19 in the aperture region A1 and the thin film transistor disposing region A2. The second barrier layer 19 is disposed correspondingly in the gate driver on array circuit region GOA.

The second barrier layer 19 is configured to block the alkaline cation from spreading along the direction to the active layer 14. Along a direction at a right angle from the first metal layer 16 to the active layer 14, a depth by which the alkaline cation enters the second barrier layer 19 is less than or equal to 20 Å.

It can be understood that the shallower the depth by which the alkaline cation spreads and enters the second barrier layer 19 is, the stronger a blocking capability of the second barrier layer 19 to the alkaline cation is, and the stronger the stability of the second thin film transistor T2 is.

Furthermore, the second barrier layer 19 comprises the second aperture k2 defined in the second barrier layer 19 in the aperture region A1. Namely, the second barrier layer 19 avoids the aperture region A1 by the second aperture k2, which increases the light transmittance of the aperture region A1.

Optionally, material of the second barrier layer 19 can comprise at least one of silicon nitride, hafnium oxide, aluminum oxide, and zirconia.

In the present embodiment, material of the second barrier layer 19 is silicon nitride. Silicon nitride, after film formation, has a film layer with high compactness and strong blocking capability, which can thin the second barrier layer 19. Also, silicon nitride has a comparative low cost and advantages in mass production.

Optionally, a thickness of the second barrier layer 19 ranges from 200 Å to 2000 Å, for instance, the thickness can be 200 Å, 300 Å, 400 Å, 500 Å, 600 Å, 700 Å, 800 Å, 900 Å, 1000 Å, 1100 Å, 1200 Å, 1300 Å, 1400 Å, 1500 Å, 1600 Å, 1700 Å, 1800 Å, 1900 Å, or 2000 Å.

It can be understood that because the ion has a certain spreading capability in a normal temperature, the thicker the second barrier layer 19 is, the harder the ion spreads and penetrates the second barrier layer 19, the better a blocking effect of the second barrier layer 19 to the alkaline cation is, and the longer the time period for blocking the alkaline cation is, which also increases a process cost.

Furthermore, because the second barrier layer 19 is added between the gate electrode 161 and the active layer 14 of the first thin film transistor T1, a gate anti-penetration ability of the first thin film transistor T1 is improved and the stability of the first thin film transistor T1 is increased.

It should be explained that anti-penetration means that when a voltage is applied to the gate electrode insulation layer, the gate electrode insulation layer exhibits insulation properties without a comparative large current passing through the gate electrode insulation layer.

When after manufacture of the array substrate 100 is completed, the first barrier layer 12 and the second barrier layer 19 can be tested by a secondary ion mass spectrometry (SIMS) to obtain a spreading situation of the alkaline cation in the first barrier layer 12 and the second barrier layer 19.

Optionally, in an embodiment, a corner of the second barrier layer 19 is rounded for transition connection.

Optionally, in an embodiment, the array substrate 100 further comprises a demultiplex circuit region DE. The demultiplex circuit region DE is located at at least one end of the pixel display region AA.

The first barrier layer 12, the buffer layer 13, the active layer 14, the gate electrode insulation layer 15, the first metal layer 16, the source and drain insulation layer 17, and the second metal layer 18 are also disposed correspondingly in the demultiplex circuit region DE. The gate electrode 161, the active layer 14, the source electrode 181, and the drain electrode 182 in the demultiplex circuit region DE are configured to constitute the third thin film transistor T3.

A thickness d1 of a portion of the gate electrode insulation layer 15 disposed in the demultiplex circuit region DE is less than a thickness d2 of a portion of the gate electrode insulation layer 15 disposed in the gate driver on array circuit region GOA.

The first barrier layer 12 is disposed correspondingly in the demultiplex circuit region DE, can block the alkaline cation from spreading to the active layer 14, and improve the stability of the third thin film transistor.

Furthermore, the thickness d1 of the portion of the gate electrode insulation layer 15 disposed in the demultiplex circuit region DE is less than the thickness d2 of the portion of the gate electrode insulation layer 15 disposed in the gate driver on array circuit region GOA such that a distance of the gate electrode 161 of the third thin film transistor T3 from a channel of the active layer 14 is shorter to make a threshold voltage Vth required by the third thin film transistor T3 smaller, which improves a turning-on speed of the third thin film transistor T3 to fulfill a demand of the demultiplex circuit.

Optionally, a thickness of a portion of the gate electrode insulation layer 15 disposed in the pixel display region AA is equal to the thickness d2 of the portion of the gate electrode insulation layer 15 disposed in the gate driver on array circuit region GOA, which improves the stability of the first thin film transistor T1 and the second thin film transistor T2 and lowers the difficulty of processes.

Optionally, in an embodiment, the thickness of the portion of the gate electrode insulation layer 15 disposed in the pixel display region AA is greater than the thickness d1 of the portion of the gate electrode insulation layer 15 disposed in the demultiplex circuit region DE.

Namely, the present application, by thinning the thickness d1 of the portion of the gate electrode insulation layer 15 disposed in the demultiplex circuit region DE, can meet a requirement for the stability of the first thin film transistor T1 and the second thin film transistor T2 and a requirement for fast activation of the third thin film transistor T3, and simplify process steps.

Optionally, in some embodiments, a thickness of a portion of the gate electrode insulation layer 15 disposed in the pixel display region AA is less than a thickness of a portion of the gate electrode insulation layer 15 disposed in the gate driver on array circuit region GOA, which can further improve the stability of the second thin film transistor T2.

Optionally, in an embodiment, the second barrier layer 19 comprises a third aperture k3 defined in the second barrier layer 19 in the demultiplex circuit region DE. Namely, the second barrier layer 19 avoids the demultiplex circuit region DE, which shortens a distance between the gate electrode 161 and the active layer 14 and can further improve the activation speed of the third thin film transistor T3.

Optionally, in an embodiment, the array substrate 100 further comprises a light shielding layer zg1. The light shielding layer zg1 and the first barrier layer 12 are disposed on the same side of the substrate 11. The light shielding layer zg1 comprises a fourth aperture k4 defined in the light shielding layer zg1 in the aperture region A1. The light shielding layer zg1 is at least correspondingly disposed in the thin film transistor disposing region A2. The light shielding layer zg1 at least overlaps a portion of the active layer 14 located in the thin film transistor disposing region A2.

Optionally, in an embodiment, the light shielding layer zg1 is disposed between the buffer layer 13 and the first barrier layer 12.

The light shielding layer zg1 is defined with the fourth aperture k4 in the aperture region A1 to avoid the aperture region A1 to increase a light transmittance of the aperture region A1. Second, the light shielding layer zg1 shields the active layer 14 of the first thin film transistor T1, which can prevent the first thin film transistor T1 from light irradiation.

Figure 2:
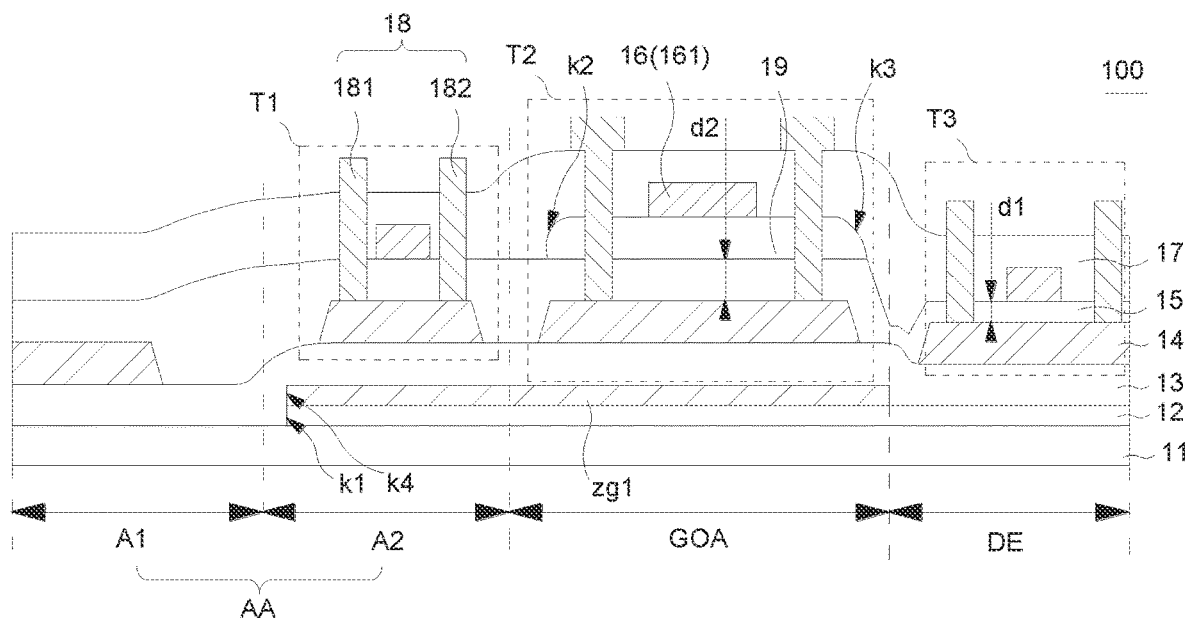
FIG. 2 is another schematic structural view of the array substrate provided by the embodiment of the present application.

Optionally, with reference to FIG. 2, in an embodiment, the light shielding layer zg1 also overlaps the active layer 14 located in the gate driver on array circuit region GOA. Namely, the light shielding layer zg1 also shields the active layer 14 of the second thin film transistor T2, which can prevent the second thin film transistor T2 from light irradiation.

Figure 14:
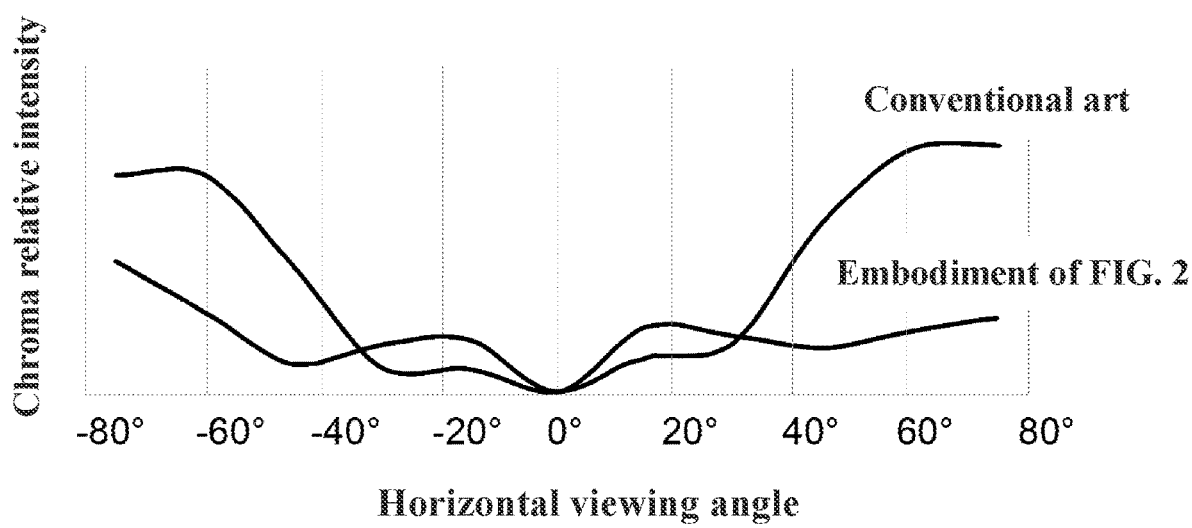
FIG. 14 is a curvature comparison chart of viewing angle vs. chroma relative intensity of an embodiment corresponding to FIG. 2 of the present application and the conventional art.

With reference to FIG. 14, it should be explained that a display panel corresponding to an array substrate of the conventional art employs a lamination layer of a silicon nitride film layer and a silicon oxide film layer as a buffer layer, and the silicon nitride film layer and the silicon oxide film layer are disposed on an entire surface. Material of the gate electrode insulation layer is silicon oxide, and it is evenly disposed on an entire surface. In the embodiment corresponding to FIG. 2, the buffer layer is a silicon oxide film layer, the first barrier layer and the second barrier layer are silicon nitride, and the gate electrode insulation layer is silicon oxide.

Under the same test conditions and environmental conditions, the viewing angle-color cast curvature chart of FIG. 14 is obtained. According to FIG. 14, an optical stability of a horizontal viewing angle of the display panel corresponding to the embodiment of FIG. 2 of the present application as a whole is better than that of the conventional art.

Furthermore, the light transmittance of the display panel of the conventional art is 95.31%, while the light transmittance of the display panel corresponding to FIG. 2 is 99.9%, almost close to 100%.

Therefore, the embodiment corresponding to FIG. 2, when applied to the display panel, comprises excellent optical stability and light transmittance.

Figure 3:
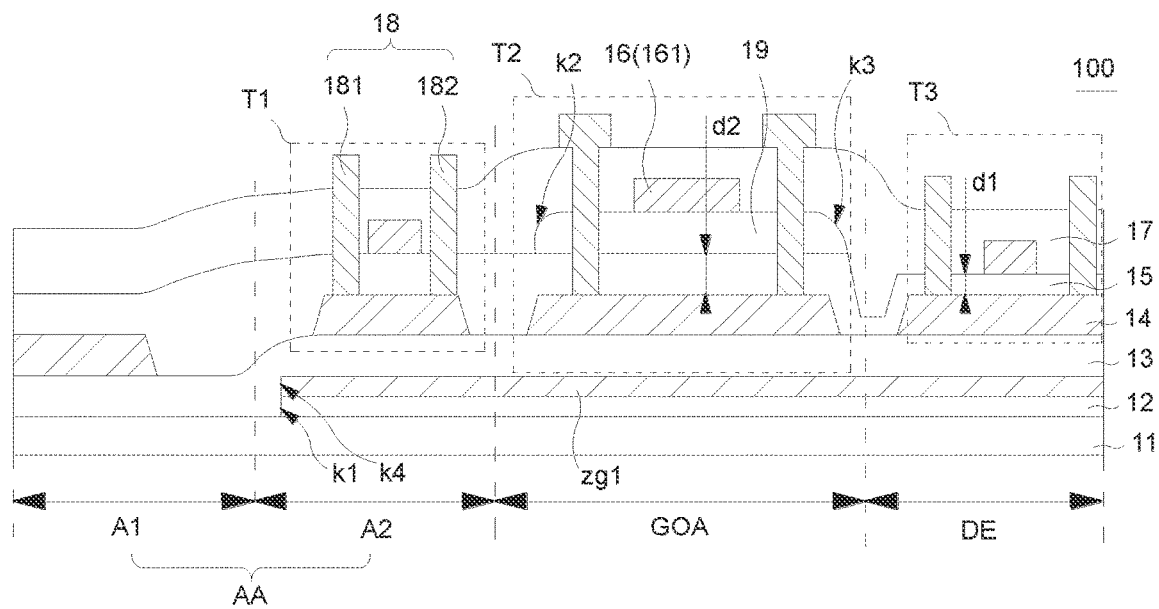
FIG. 3 is still another schematic structural view of the array substrate provided by the embodiment of the present application.

Optionally, with reference to FIG. 3, in an embodiment, the light shielding layer zg1 also overlaps the active layer 14 of the demultiplex circuit region DE. Namely, the light shielding layer zg1 also shields the active layer 14 of the third thin film transistor T3, which can prevent the third thin film transistor T3 from light irradiation.

Figure 4:
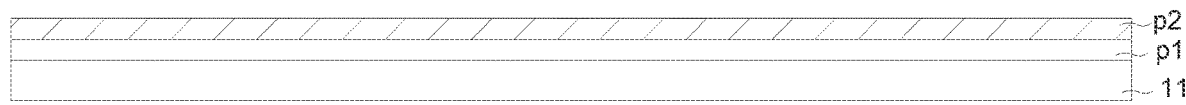
FIG. 4 is a schematic view of a step B1 of an array substrate manufacturing method provided by an embodiment of the present application.

The array substrate 100 of the present embodiment utilizes the embodiment of FIG. 3 as an example to describe a manufacturing method. The manufacturing method for the array substrate 100 of the present embodiment comprises steps as follows:

A step B1, with reference to FIG. 4, comprises sequentially depositing a first barrier material layer p1 and a light shielding material layer p2 on the substrate 11.

Figure 5:
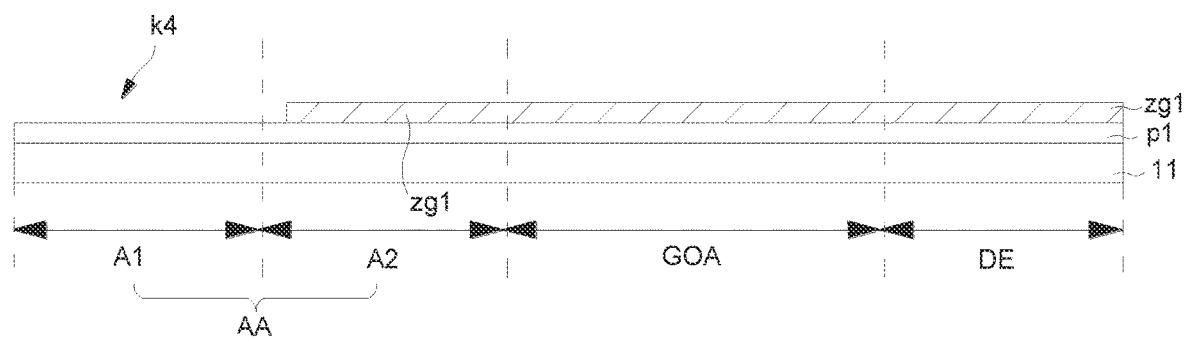
FIG. 5 is a schematic view of a step B2 of the array substrate manufacturing method provided by the embodiment of the present application.

A step B2, with reference to FIG. 5, comprises patterning the light shielding material layer p2 and retaining the first barrier material layer p1 to form a light shielding layer zg1. The light shielding layer zg1 avoids the aperture region A1 and is disposed correspondingly in the thin film transistor disposing region A2, the gate driver on array circuit region GOA, and the demultiplex circuit region DE.

Figure 6:
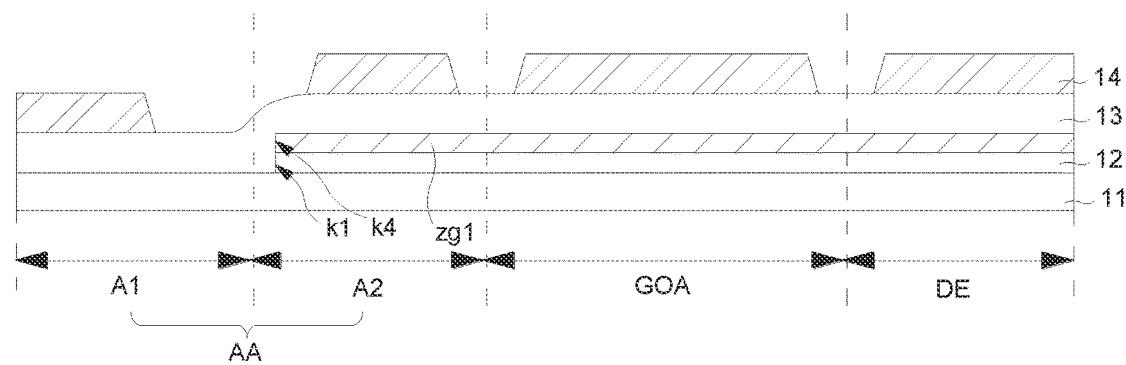
FIG. 6 is a schematic view of a step B3 of the array substrate manufacturing method provided by the embodiment of the present application.

A step B3, with reference to FIG. 6, comprises patterning a first barrier material layer p1 to form a first barrier layer 12. The first barrier layer 12 avoids the aperture region A1 and is disposed correspondingly in the thin film transistor disposing region A2, the gate driver on array circuit region GOA, and the demultiplex circuit region DE.

Then, a buffer layer 13 and an active layer 14 are sequentially formed on the light shielding layer zg1. The buffer layer 13 is disposed on an entire surface. The active layer 14 is disposed correspondingly in the thin film transistor disposing region A2, the gate driver on array circuit region GOA, and the demultiplex circuit region DE. A portion of the active layer 14 can also be disposed correspondingly in the aperture region A1.

Figure 7:
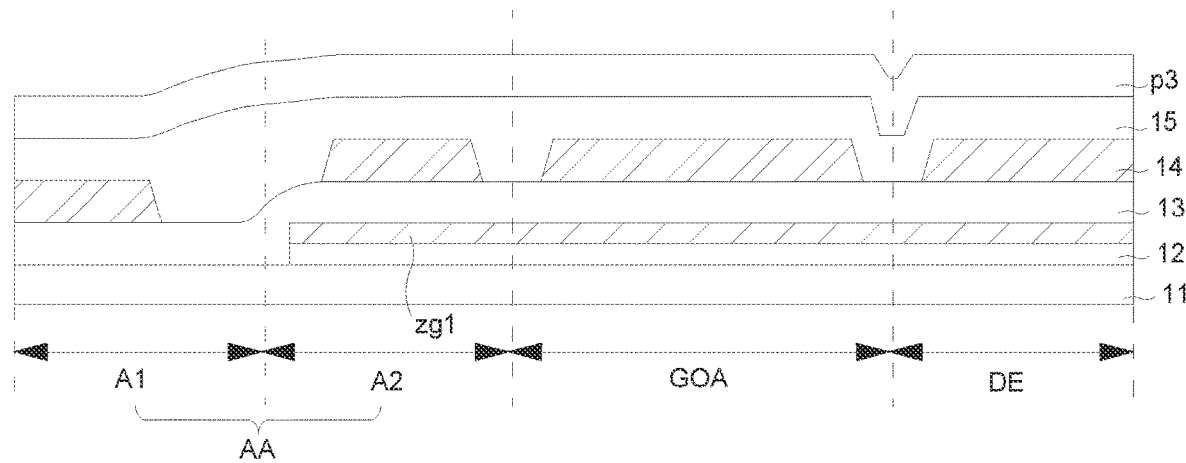
FIG. 7 is a schematic view of a step B4 of the array substrate manufacturing method provided by the embodiment of the present application.

A step B4, with reference to FIG. 7, comprises sequentially forming a gate electrode insulation layer 15 and a second barrier material layer p3 on the active layer 14.

Figure 8:
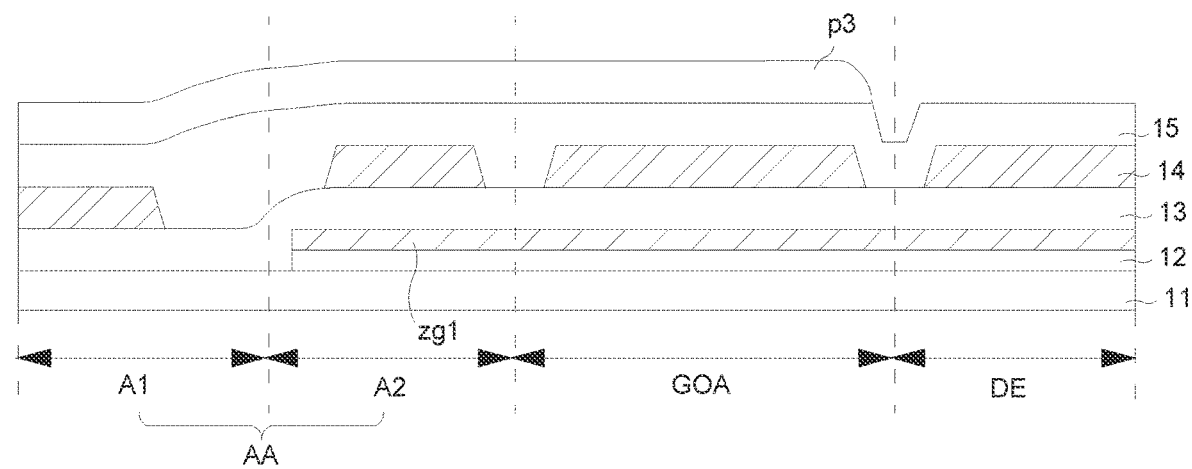
FIG. 8 is a schematic view of a step B5 of the array substrate manufacturing method provided by the embodiment of the present application.

A step B5, with reference to FIG. 8, comprises removing a portion of the second barrier material layer p3 corresponding to the demultiplex circuit region DE.

Figure 9:
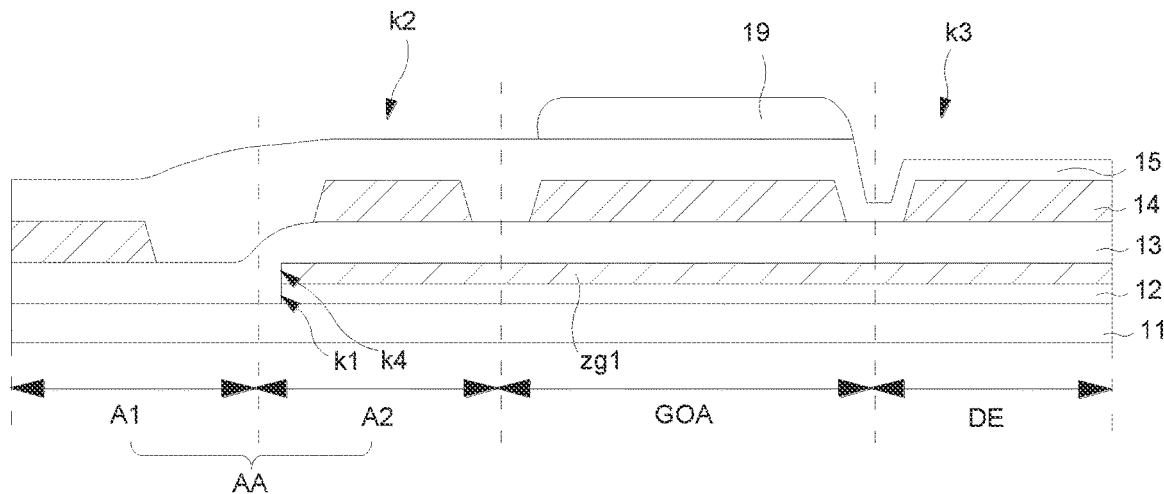
FIG. 9 is a schematic view of a step B6 of the array substrate manufacturing method provided by the embodiment of the present application.

A step B6, with reference to FIG. 9, comprises removing a portion of the second barrier material layer p3 corresponding to the pixel display region AA to form a second barrier layer 19, and thinning a portion of the gate electrode insulation layer 15 corresponding to the demultiplex circuit region DE.

Figure 10:
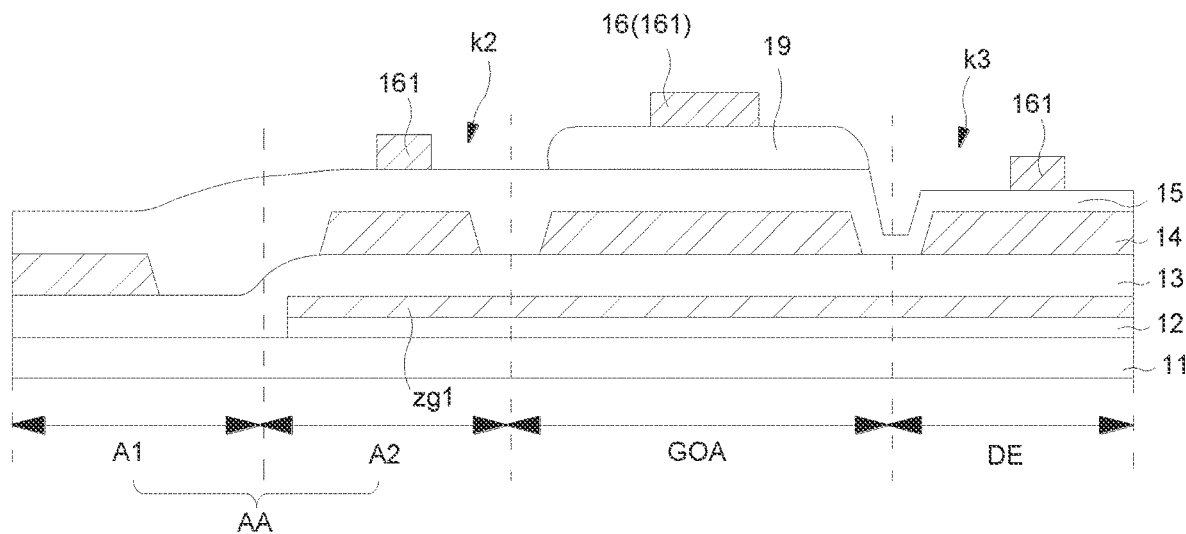
FIG. 10 is a schematic view of a step B7 of the array substrate manufacturing method provided by the embodiment of the present application.

A step B7, with reference to FIG. 10, comprises forming a patterned first metal layer 16 on the gate electrode insulation layer 15, wherein the first metal layer 16 comprises a gate electrode 161.

Figure 11:
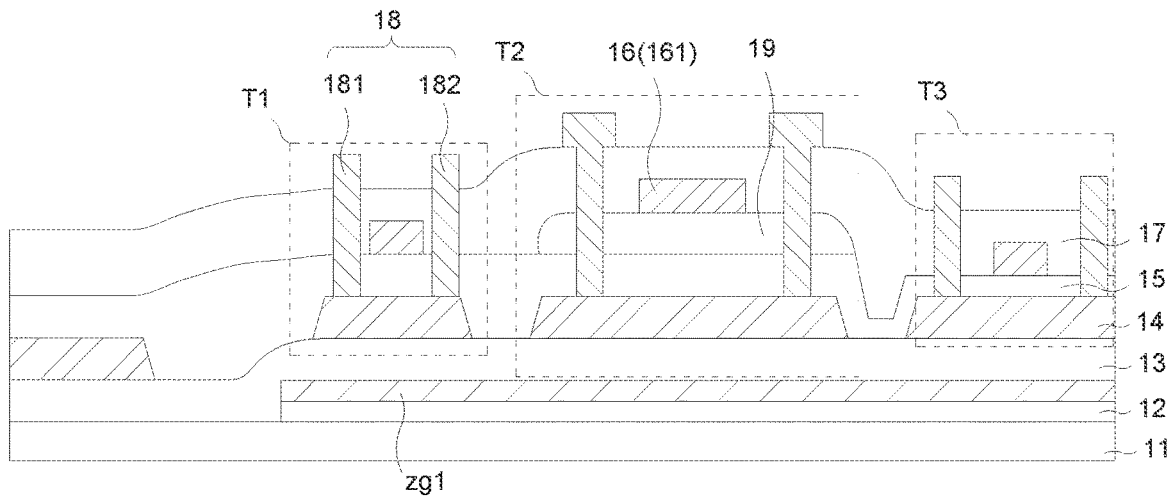
FIG. 11 is a schematic view of a step B8 of the array substrate manufacturing method provided by the embodiment of the present application.

A step B8, with reference to FIG. 11, comprises sequentially forming a source and drain insulation layer 17 and a second metal layer 18 on the first metal layer 16. The second metal layer 18 comprises a source electrode 181 and a drain electrode 182.

Optionally, the array substrate 100 further comprises a pixel electrode (not shown in the figures), and the pixel electrode is disposed correspondingly in the aperture region A1. The pixel electrode is connected to the first thin film transistor T1.

Figure 12:
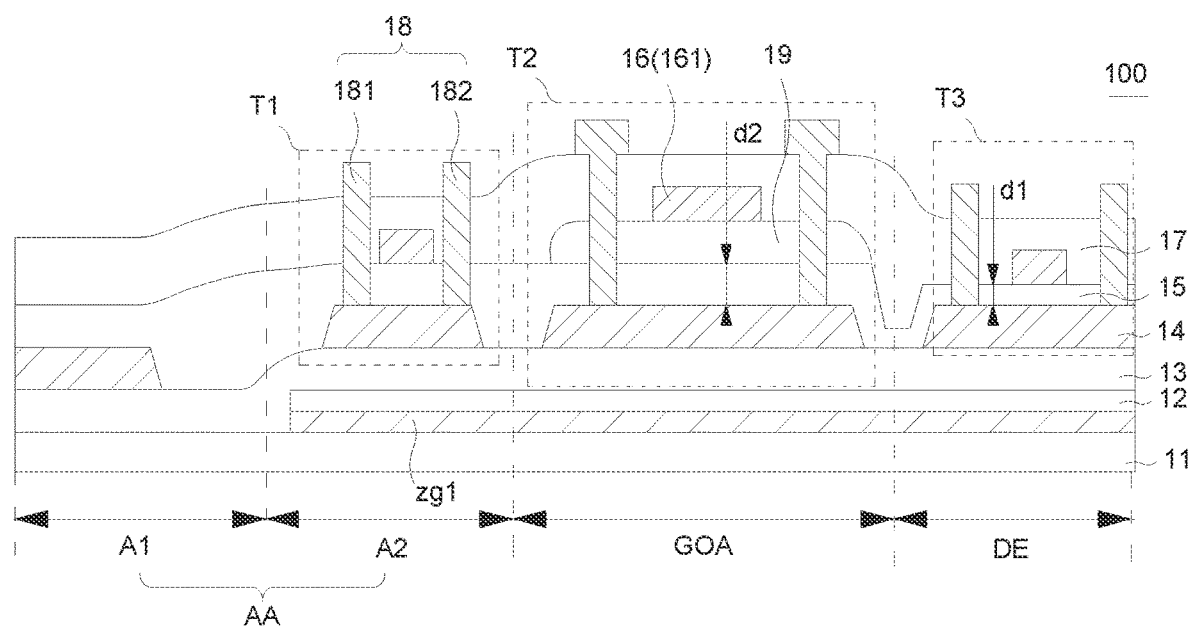
FIG. 12 is still another schematic structural view of the array substrate provided by the embodiment of the present application.

Optionally, with reference to FIG. 12, in some embodiments, the light shielding layer zg1 is disposed between the substrate 11 and the first barrier layer 12.

Figure 13:
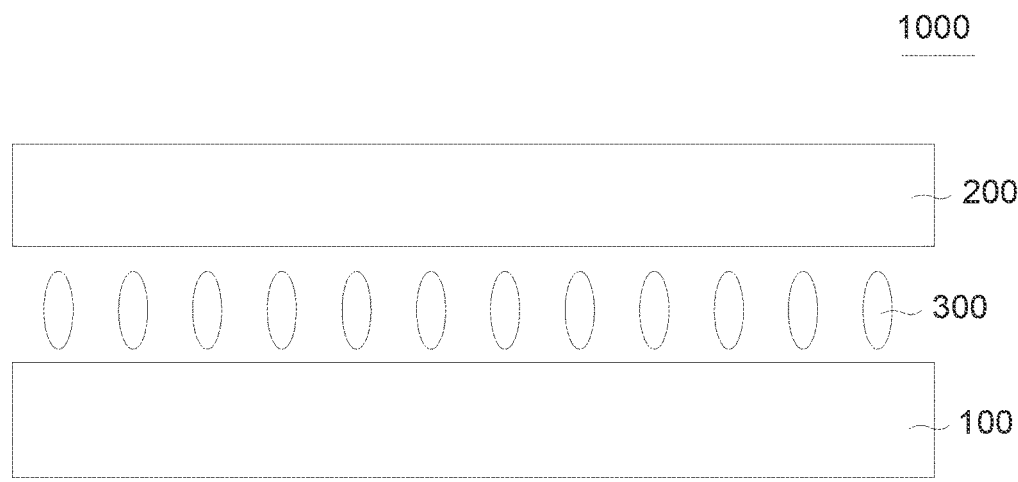
FIG. 13 is a schematic structural view of a liquid crystal display panel provided by the embodiment of the present application.

With reference to FIG. 13, the embodiment of the present application further provides a liquid crystal display panel 1000 comprising the array substrate 100 as any one of the above embodiments, an opposite substrate 200 and a liquid crystal 300 disposed between the array substrate 100 and the opposite substrate 200.

The structure of the array substrate of the liquid crystal panel 1000 of the embodiment of the present application is similar to or the same as the structure of the array substrate 100 of any one of the above embodiments, thus no repeated description is here.

Optionally, the opposite substrate 200 has a black matrix layer, and the black matrix layer is disposed correspondingly out of the aperture region A1.

Optionally, in some embodiments, black matrix layer can also be integrated in the array substrate 100.

Optionally, in some embodiments, the black matrix layer can also be replaced with color resists of different colors stacked together.

The liquid crystal display panel of the embodiment of the present application employs the first barrier layer avoiding the aperture region, and is at least correspondingly disposed in thin film transistor disposing region and the gate driver on array circuit region. The first barrier layer is configured to block the alkaline cation from spreading along a direction to the active layer. Along a direction at a right angle from the substrate to the active layer, a depth by which the alkaline cation enters the first barrier layer is less than or equal to 20 Å.

Because the first barrier layer avoids the aperture region, it improves the light transmittance capability of the aperture region. Also, the first barrier layer is disposed in the thin film transistor disposing region and the gate driver on array circuit region configured to block the alkaline cation from entering the active layer, which improves the stability of thin film transistors in the thin film transistor disposing region and the gate driver on array circuit region. Furthermore, after manufacturing the array substrate, the depth by which the alkaline cation spreads and enters the first barrier layer is less than or equal to 20 Å, which can ensure that the alkaline cation would not spread to the active layer, and even would not spread to the active layer after a very long time period, which achieves improvement of a time length of the thin film transistor stability and an adequately thinned thickness of the first barrier layer while improving the thin film transistor stability.

The array substrate and the liquid crystal display panel provided by the embodiment of the present application are described in detail as above. In the specification, the specific examples are used to explain the principle and embodiment of the present application. The above description of the embodiments is only used to help understand the method of the present application and its spiritual idea. Meanwhile, for those skilled in the art, according to the present idea of invention, changes will be made in specific embodiment and application. In summary, the contents of this specification should not be construed as limiting the present application.

What is claimed is:

1. An array substrate, comprising a pixel display region and a gate driver on array circuit region, wherein the gate driver on array circuit region is located on at least one side of the pixel display region, the pixel display region comprises an aperture region and a thin film transistor disposing region, the aperture region is located on a side of the thin film transistor disposing region, the aperture region is configured to transmit light from a backlight module, and the array substrate comprises:
- a substrate;
- a first barrier layer disposed on the substrate, wherein the first barrier layer comprises a first aperture in the aperture region, the first barrier layer are at least disposed correspondingly in the thin film transistor disposing region and the gate driver on array circuit region;
- a buffer layer disposed on a side of the first barrier layer away from the substrate, wherein the buffer layer covers the aperture region, the thin film transistor disposing region, and the gate driver on array circuit region;
- a thin film transistor structure layer disposed on a surface of the buffer layer away from the substrate, wherein the thin film transistor structure layer comprises a first thin film transistor and a second thin film transistor, the first thin film transistor is located in the thin film transistor disposing region, and the second thin film transistor is disposed in the gate driver on array circuit region;
- wherein the first barrier layer is configured to block an alkaline cation from spreading along a direction toward the active layer, and along a direction at a right angle from the substrate to the active layer, a depth by which the alkaline cation enters the first barrier layer is less than or equal to 20 Å.

2. The array substrate according to claim 1, wherein the thin film transistor structure layer comprises an active layer, a gate electrode insulation layer, and a first metal layer, the active layer is disposed on a surface of the buffer layer away from the substrate, the gate electrode insulation layer is disposed on a surface of the active layer away from the buffer layer, the first metal layer comprises a gate electrode, the first metal layer is disposed on a surface of the gate electrode insulation layer away from the active layer, the first metal layer is at least disposed in the thin film transistor disposing region and the gate driver on array circuit region;
- the array substrate further comprises a second barrier layer disposed between the first metal layer and the gate electrode insulation layer, the second barrier layer comprises a second aperture defined between the aperture region and the thin film transistor disposing region, the second barrier layer is disposed correspondingly in the gate driver on array circuit region; and
- the second barrier layer is configured to block the alkaline cation from spreading along the direction toward the active layer, and along a direction at a right angle from the first metal layer to the active layer, a depth by which the alkaline cation enters the second barrier layer is less than or equal to 20 Å.

3. The array substrate according to claim 2, wherein the array substrate further comprises a demultiplex circuit region, the demultiplex circuit region is located at at least one end of the pixel display region;
- the first barrier layer, the buffer layer, the active layer, the gate electrode insulation layer, and the first metal layer are disposed correspondingly in the demultiplex circuit region, and the thin film transistor structure layer further comprises a third thin film transistor located in the demultiplex circuit region; and
- a thickness of a portion of the gate electrode insulation layer disposed in the demultiplex circuit region is less than a thickness of a portion of the gate electrode insulation layer disposed in the gate driver on array circuit region.

4. The array substrate according to claim 3, wherein a thickness of a portion of the gate electrode insulation layer disposed in the pixel display region is less than a thickness of a portion of the gate electrode insulation layer disposed in the gate driver on array circuit region.

5. The array substrate according to claim 4, wherein the thickness of the portion of the gate electrode insulation layer disposed in the pixel display region is greater than the thickness of the portion of the gate electrode insulation layer disposed in the demultiplex circuit region.

6. The array substrate according to claim 3, wherein the second barrier layer comprises a third aperture defined in the second barrier layer in the demultiplex circuit region.

7. The array substrate according to claim 1, wherein a dielectric constant of the gate electrode insulation layer is greater than or equal to 6.8.

8. The array substrate according to claim 1, wherein a light transmittance of each of the gate electrode insulation layer and the buffer layer is greater than or equal to 90%.

9. The array substrate according to claim 8, wherein the gate electrode insulation layer is a single-film layer structure or a multi-film layer stack structure, and the buffer layer is a single-film layer structure or a multi-film layer stack structure.

10. The array substrate according to claim 1, wherein the array substrate further comprises a light shielding layer, the light shielding layer and the first barrier layer are disposed on a side of the substrate, the light shielding layer comprises a fourth aperture defined in the light shielding layer in the aperture region, the light shielding layer is at least correspondingly disposed in the thin film transistor disposing region, and the light shielding layer at least overlaps a portion of the active layer located in the thin film transistor disposing region.

11. The array substrate according to claim 10, wherein the light shielding layer is disposed between the buffer layer and the first barrier layer, or, the light shielding layer is disposed between the substrate and the first barrier layer.

12. The array substrate according to claim 1, wherein material of the gate electrode insulation layer comprises at least one of silicon oxide, silicon oxynitride, hafnium oxide, and aluminum oxide, and material of the buffer layer comprises at least one of silicon oxide, silicon oxynitride, hafnium oxide, aluminum oxide, polyvinyl alcohol, polyethylene glycol, and polyethylene glycol.

13. The array substrate according to claim 3, wherein the thin film transistor structure layer further comprises:
- a source and drain insulation layer disposed on a surface of the first metal layer away from the buffer layer and covering the gate electrode insulation layer; and
- a second metal layer disposed on a surface of the source and drain insulation layer away from the gate electrode insulation layer, wherein the second metal layer is at least disposed in the thin film transistor disposing region and the gate driver on array circuit region, the second metal layer comprises a source electrode and a drain electrode, in the thin film transistor, the source electrode is connected to a source electrode contact region of the active layer, the drain electrode is connected to a drain electrode contact region of the active layer;
- wherein the gate electrode, the active layer, the source electrode, and the drain electrode located in the thin film transistor disposing region are configured to constitute the first thin film transistor, the gate electrode, the active layer, the source electrode, and the drain electrode located in the gate driver on array circuit region are configured to constitute the second thin film transistor, and the gate electrode, the active layer, the source electrode, and the drain electrode located in the demultiplex circuit region are configured to constitute the third thin film transistor.

14. A liquid crystal display panel, comprising an array substrate;
    the array substrate comprises a pixel display region and a gate driver on array circuit region, the gate driver on array circuit region is located on at least one side of the pixel display region, the pixel display region comprises an aperture region and a thin film transistor disposing region, the aperture region is located on a side of the thin film transistor disposing region, the aperture region is configured to transmit light from a backlight module, and the array substrate comprises:
    a substrate;
    a first barrier layer disposed on the substrate, wherein the first barrier layer comprises a first aperture in the aperture region, the first barrier layer are at least disposed correspondingly in the thin film transistor disposing region and the gate driver on array circuit region;
    a buffer layer disposed on a side of the first barrier layer away from the substrate, wherein the buffer layer covers the aperture region, the thin film transistor disposing region, and the gate driver on array circuit region;
    a thin film transistor structure layer disposed on a surface of the buffer layer away from the substrate, wherein the thin film transistor structure layer comprises a first thin film transistor and a second thin film transistor, the first thin film transistor is located in the thin film transistor disposing region, and the second thin film transistor is disposed in the gate driver on array circuit region;
    wherein the first barrier layer is configured to block an alkaline cation from spreading along a direction toward the active layer, and along a direction at a right angle from the substrate to the active layer, a depth by which the alkaline cation enters the first barrier layer is less than or equal to 20 Å.

15. The liquid crystal display panel according to claim 14, wherein the thin film transistor structure layer comprises an active layer, a gate electrode insulation layer, and a first metal layer, the active layer is disposed on a surface of the buffer layer away from the substrate, the gate electrode insulation layer is disposed on a surface of the active layer away from the buffer layer, the first metal layer comprises a gate electrode, the first metal layer is disposed on a surface of the gate electrode insulation layer away from the active layer, the first metal layer is at least disposed in the thin film transistor disposing region and the gate driver on array circuit region;
    the array substrate further comprises a second barrier layer disposed between the first metal layer and the gate electrode insulation layer, the second barrier layer comprises a second aperture defined between the aperture region and the thin film transistor disposing region, the second barrier layer is disposed correspondingly in the gate driver on array circuit region; and
    the second barrier layer is configured to block the alkaline cation from spreading along the direction toward the active layer, and along a direction at a right angle from the first metal layer to the active layer, a depth by which the alkaline cation enters the second barrier layer is less than or equal to 20 Å.

16. The liquid crystal display panel according to claim 15, wherein the array substrate further comprises a demultiplex circuit region, the demultiplex circuit region is located at at least one end of the pixel display region;
    the first barrier layer, the buffer layer, the active layer, the gate electrode insulation layer, and the first metal layer are disposed correspondingly in the demultiplex circuit region, and the thin film transistor structure layer further comprises a third thin film transistor located in the demultiplex circuit region; and
    a thickness of a portion of the gate electrode insulation layer disposed in the demultiplex circuit region is less than a thickness of a portion of the gate electrode insulation layer disposed in the gate driver on array circuit region.

17. The liquid crystal display panel according to claim 16, wherein a thickness of a portion of the gate electrode insulation layer disposed in the pixel display region is less than a thickness of a portion of the gate electrode insulation layer disposed in the gate driver on array circuit region.

18. The liquid crystal display panel according to claim 17, wherein the thickness of the portion of the gate electrode insulation layer disposed in the pixel display region is greater than the thickness of the portion of the gate electrode insulation layer disposed in the demultiplex circuit region.

19. The liquid crystal display panel according to claim 16, wherein the second barrier layer comprises a third aperture defined in the second barrier layer in the demultiplex circuit region.

20. The liquid crystal display panel according to claim 14, wherein a dielectric constant of the gate electrode insulation layer is greater than or equal to 6.8.

* * * * *